US011524369B2

(12) United States Patent
DeMuth et al.

(10) Patent No.: US 11,524,369 B2
(45) Date of Patent: *Dec. 13, 2022

(54) CHAMBER SYSTEMS FOR ADDITIVE MANUFACTURING

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 97 days.

This patent is subject to a terminal disclaimer.

(21) Appl. No.: 17/076,198

(22) Filed: Oct. 21, 2020

(65) Prior Publication Data

US 2021/0031267 A1 Feb. 4, 2021

Related U.S. Application Data

(63) Continuation of application No. 15/336,485, filed on Oct. 27, 2016, now Pat. No. 10,843,266.

(Continued)

(51) Int. Cl.
| | |
|---|---|
| *B23K 37/04* | (2006.01) |
| *B29C 64/264* | (2017.01) |
| *B29C 64/153* | (2017.01) |
| *B33Y 10/00* | (2015.01) |
| *B33Y 40/00* | (2020.01) |
| *B33Y 50/02* | (2015.01) |
| *B33Y 70/00* | (2020.01) |
| *B33Y 80/00* | (2015.01) |

(Continued)

(52) U.S. Cl.
CPC ............ *B23K 37/0408* (2013.01); *B22F 3/24* (2013.01); *B22F 10/00* (2021.01); *B22F 12/00* (2021.01); *B22F 12/33* (2021.01); *B22F 12/38* (2021.01); *B22F 12/44* (2021.01); *B22F 12/70* (2021.01); *B23K 15/002* (2013.01); *B23K 15/0006* (2013.01); *B23K 15/0013* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/264* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 27/108* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 10/10* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 26/0816* (2013.01); *G02B 27/0068* (2013.01); *G02B 27/0905* (2013.01); *G02B 27/141* (2013.01); *G02B 27/283* (2013.01); *G02B 27/286* (2013.01); *G05B 2219/49023* (2013.01); *G07C 3/146* (2013.01); *Y02P 10/25* (2015.11); *Y02P 80/40* (2015.11)

(58) Field of Classification Search
CPC ............................ B23K 37/0408; B33Y 10/00
See application file for complete search history.

(56) References Cited

U.S. PATENT DOCUMENTS

| | | | |
|---|---|---|---|
| 10,843,265 B2 * | 11/2020 | DeMuth ................. | B23K 26/03 |
| 10,843,266 B2 * | 11/2020 | DeMuth ................ | B29C 64/153 |

* cited by examiner

*Primary Examiner* — Weiping Zhu
(74) *Attorney, Agent, or Firm* — David R. Stevens; Stevens Law Group

(57) ABSTRACT

A method of additive manufacture is disclosed. The method may include creating, by a 3D printer contained within an enclosure, a part having a weight greater than or equal to 2,000 kilograms. A gas management system may maintain gaseous oxygen within the enclosure atmospheric level. In some embodiments, a wheeled vehicle may transport the part from inside the enclosure, through an airlock, as the airlock operates to buffer between a gaseous environment within the enclosure and a gaseous environment outside the enclosure, and to a location exterior to both the enclosure and the airlock.

20 Claims, 13 Drawing Sheets

Related U.S. Application Data

(60) Provisional application No. 62/248,969, filed on Oct. 30, 2015, provisional application No. 62/248,783, filed on Oct. 30, 2015, provisional application No. 62/248,839, filed on Oct. 30, 2015, provisional application No. 62/248,780, filed on Oct. 30, 2015, provisional application No. 62/248,799, filed on Oct. 30, 2015, provisional application No. 62/248,833, filed on Oct. 30, 2015, provisional application No. 62/248,841, filed on Oct. 30, 2015, provisional application No. 62/248,758, filed on Oct. 30, 2015, provisional application No. 62/248,848, filed on Oct. 30, 2015, provisional application No. 62/248,791, filed on Oct. 30, 2015, provisional application No. 62/248,980, filed on Oct. 30, 2015, provisional application No. 62/248,787, filed on Oct. 30, 2015, provisional application No. 62/248,835, filed on Oct. 30, 2015, provisional application No. 62/248,795, filed on Oct. 30, 2015, provisional application No. 62/248,765, filed on Oct. 30, 2015, provisional application No. 62/248,829, filed on Oct. 30, 2015, provisional application No. 62/248,776, filed on Oct. 30, 2015, provisional application No. 62/248,966, filed on Oct. 30, 2015, provisional application No. 62/248,989, filed on Oct. 30, 2015, provisional application No. 62/248,821, filed on Oct. 30, 2015, provisional application No. 62/248,770, filed on Oct. 30, 2015, provisional application No. 62/248,847, filed on Oct. 30, 2015, provisional application No. 62/248,968, filed on Oct. 30, 2015.

(51) Int. Cl.

| | |
|---|---|
| *B33Y 99/00* | (2015.01) |
| *B23K 26/12* | (2014.01) |
| *B23K 26/142* | (2014.01) |
| *B23K 26/144* | (2014.01) |
| *B23K 26/70* | (2014.01) |
| *B29C 64/386* | (2017.01) |
| *B29C 64/268* | (2017.01) |
| *B22F 3/24* | (2006.01) |
| *B23K 15/00* | (2006.01) |
| *B23K 15/06* | (2006.01) |
| *B23K 26/03* | (2006.01) |
| *B23K 26/08* | (2014.01) |
| *B23K 26/16* | (2006.01) |
| *B23K 26/36* | (2014.01) |
| *B25J 11/00* | (2006.01) |
| *G02B 7/14* | (2021.01) |
| *G02B 7/16* | (2021.01) |
| *G02B 7/182* | (2021.01) |
| *G02B 15/04* | (2006.01) |
| *G02B 15/10* | (2006.01) |
| *G02B 19/00* | (2006.01) |
| *G02F 1/01* | (2006.01) |
| *G02F 1/1333* | (2006.01) |
| *G02F 1/135* | (2006.01) |
| *G05B 17/02* | (2006.01) |
| *H01S 5/40* | (2006.01) |
| *B22F 12/00* | (2021.01) |
| *B22F 10/00* | (2021.01) |
| *H01S 5/00* | (2006.01) |
| *B22F 12/33* | (2021.01) |
| *B22F 12/44* | (2021.01) |
| *B22F 12/70* | (2021.01) |
| *G02B 27/10* | (2006.01) |
| *B23K 26/00* | (2014.01) |
| *B23K 26/082* | (2014.01) |
| *B23K 101/00* | (2006.01) |
| *B23K 101/24* | (2006.01) |
| *B23K 103/00* | (2006.01) |
| *B23K 101/02* | (2006.01) |
| *B29K 105/00* | (2006.01) |
| *G02B 27/28* | (2006.01) |
| *G07C 3/14* | (2006.01) |
| *B22F 10/10* | (2021.01) |
| *B33Y 30/00* | (2015.01) |
| *B23K 26/342* | (2014.01) |
| *B28B 1/00* | (2006.01) |
| *G02B 26/08* | (2006.01) |
| *G02B 27/09* | (2006.01) |
| *G02B 27/14* | (2006.01) |
| *G02B 27/00* | (2006.01) |

CHAMBER SYSTEMS FOR ADDITIVE MANUFACTURING

CROSS REFERENCE TO RELATED PATENT APPLICATION

The present disclosure is part of a continuation of U.S. patent application Ser. No. 15/336,485, filed Oct. 27, 2016 and claiming the priority benefit of the below-listed provisional applications.

U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure generally relates to additive manufacturing and, more particularly, to powder bed fusion additive manufacturing chamber designs with high throughput capabilities.

BACKGROUND

Traditional component machining often relies on removal of material by drilling, cutting, or grinding to form a part. In contrast, additive manufacturing, also referred to as three-dimensional (3D) printing, typically involves sequential layer-by-layer addition of material to build a part. As more industrial sectors adopt additive manufacturing for product innovation or mass-production tools, limitations of efficiency and throughput remain challenging to overcome. Contemporary powder bed fusion additive manufacturing systems are often operated in a batch-mode style to print an object in a build chamber. Once a print job is completed, a substantial amount of time can be required to move parts to other areas or processing chambers for further work.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure describes a method of additive manufacture that involves creating, by a first machine contained within a first enclosure, a first part. The first part can be formed by a first process that includes using a patterned energy beam, wherein the first part has a weight greater than or equal to 2,000 kilograms. A first gas management system is used to maintain gaseous oxygen within the first enclosure below atmospheric levels. A first part can be transported from inside the first enclosure through an airlock. The airlock operates to buffer between a gaseous environment within the first enclosure and a gaseous environment outside the first enclosure, and to a location exterior to both the first enclosure and the airlock. During this transport process, the weight of the first part is continuously supported.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

Figure 1A:
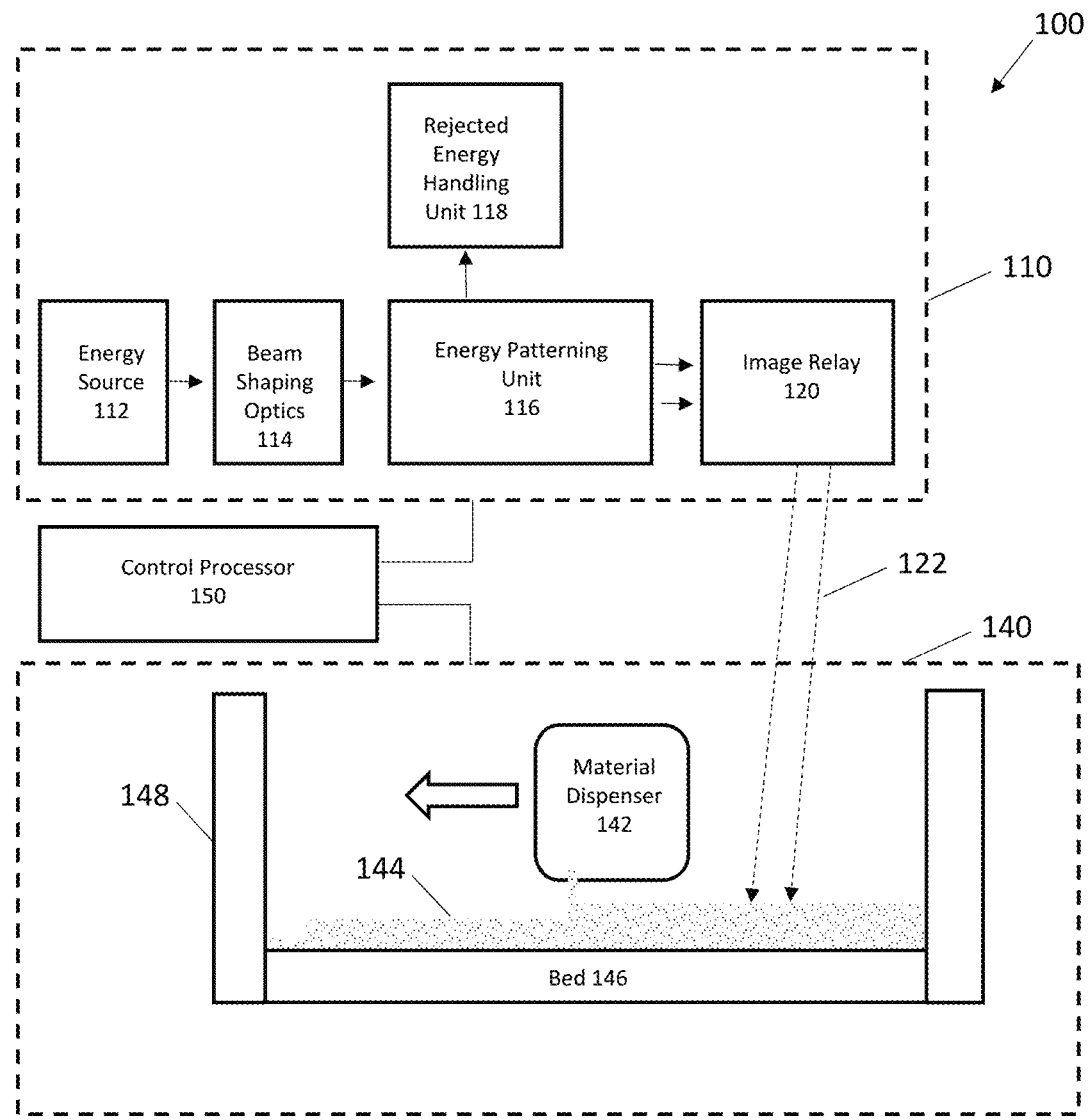
FIG. 1A illustrates an additive manufacturing system.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/$MnCl_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:$YVO_4$) laser, Neodymium doped yttrium calcium oxoborateNd:$YCa_4O(BO_3)^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:$2O_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass($147Pm^{+3}$:Glass) solid-state laser, Chromium doped chrysoberyl (alexandrite) laser, Erbium doped anderbium-ytterbium co-doped glass lasers, Trivalent uranium doped calcium fluoride (U:$CaF_2$) solid-state laser, Divalent samarium doped calcium fluoride(Sm:$CaF_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
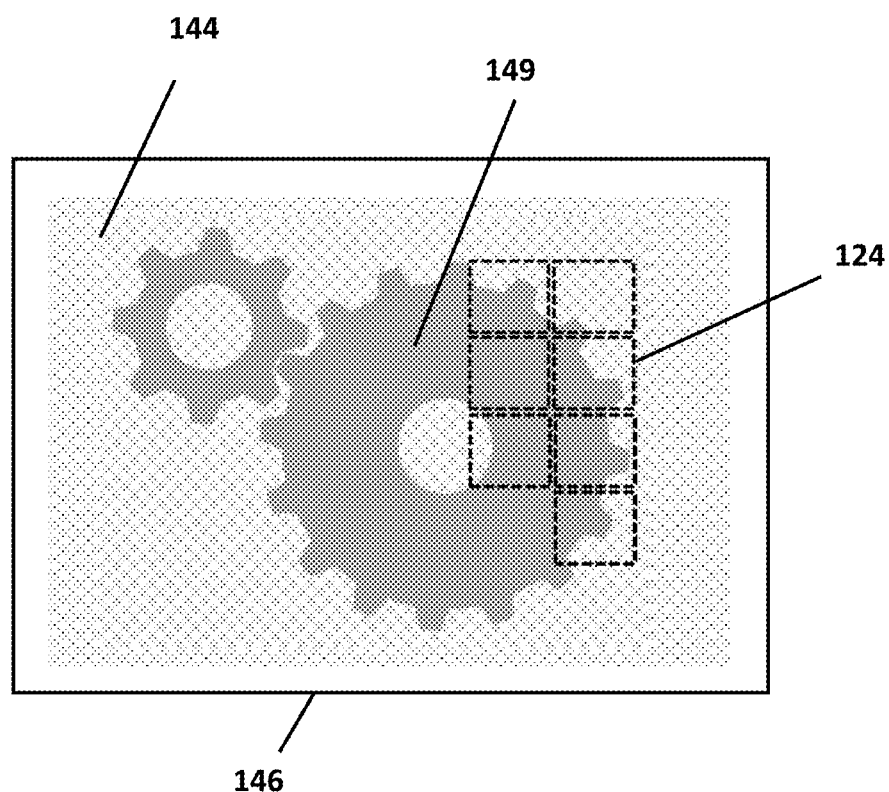
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
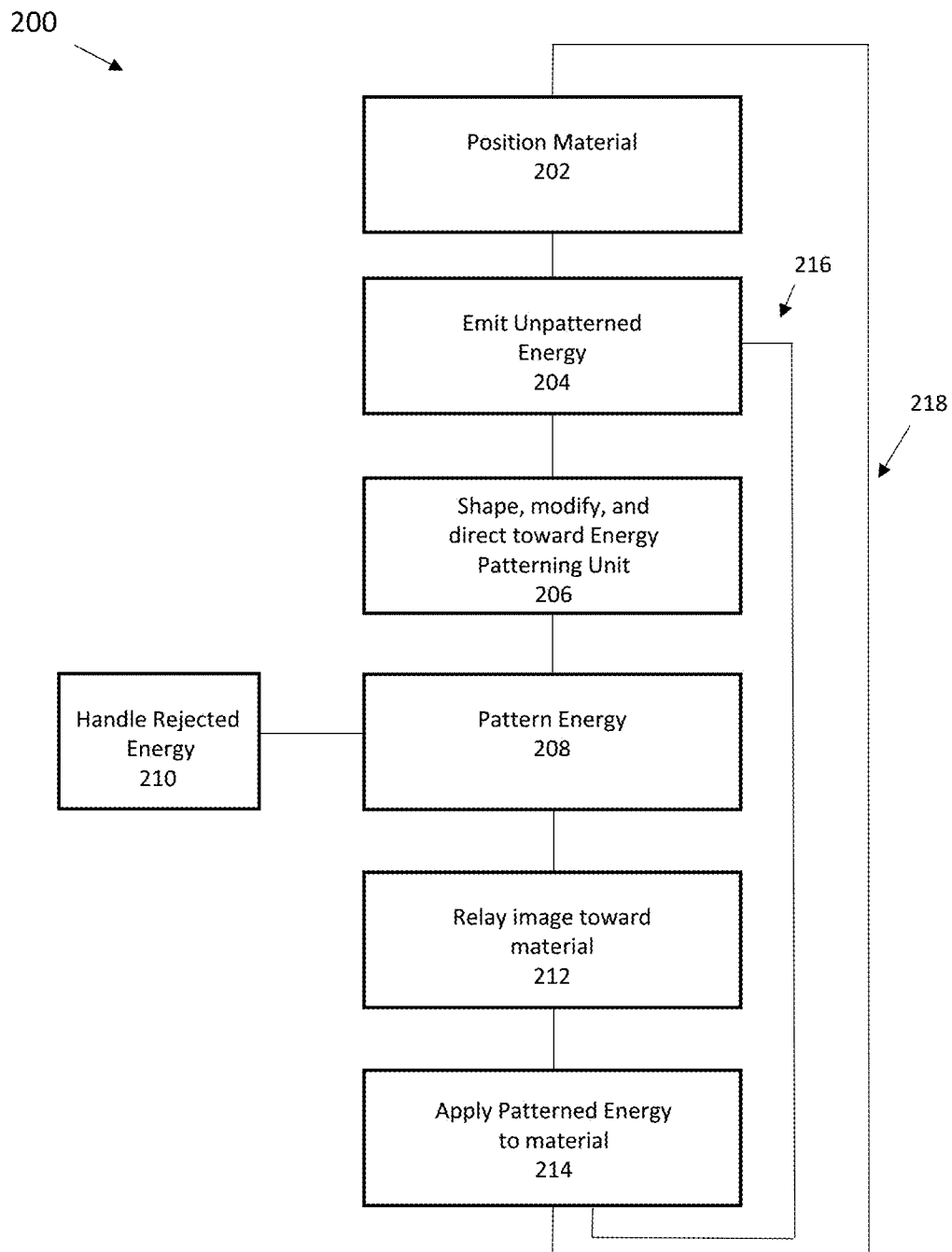
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
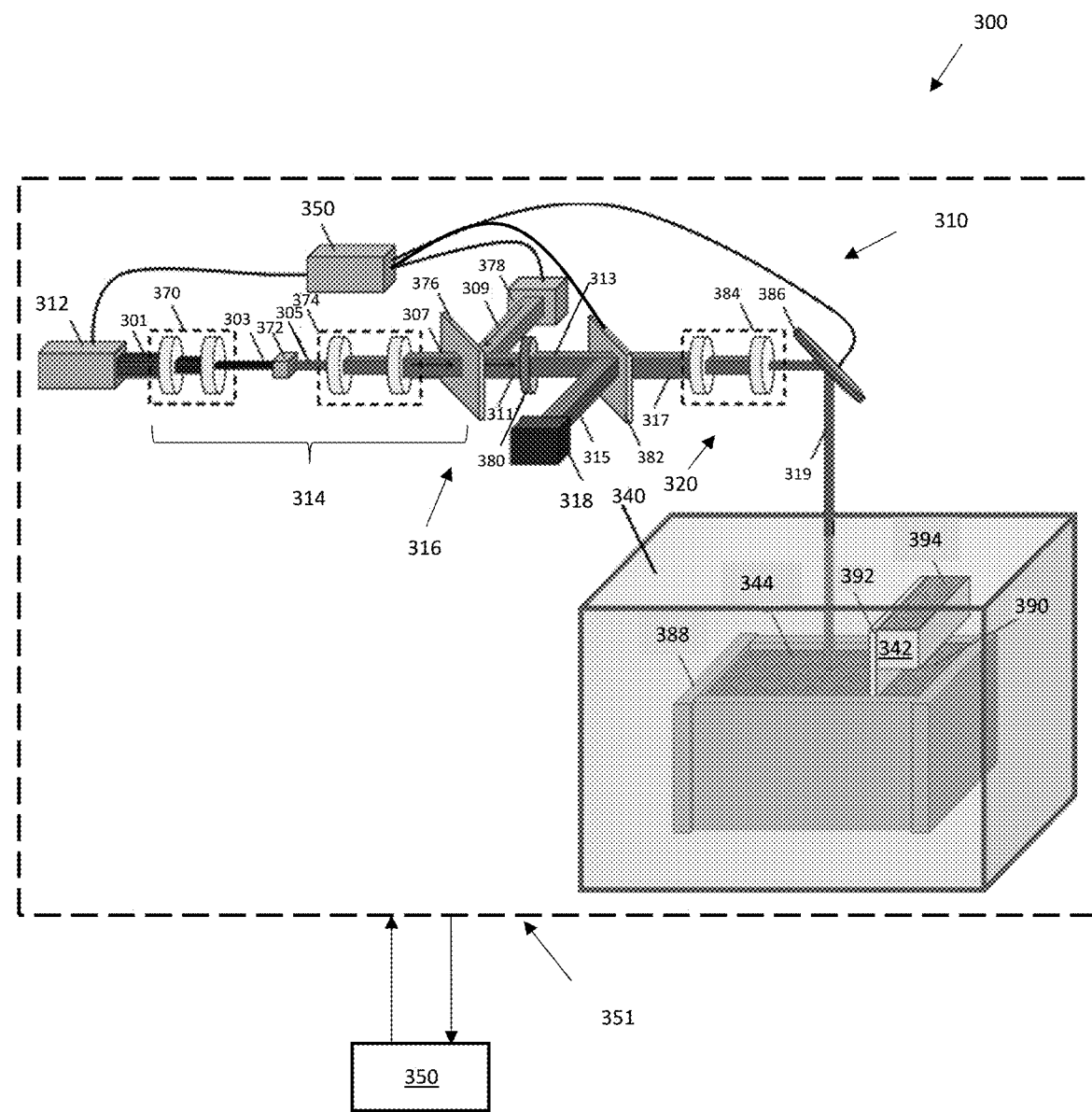
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
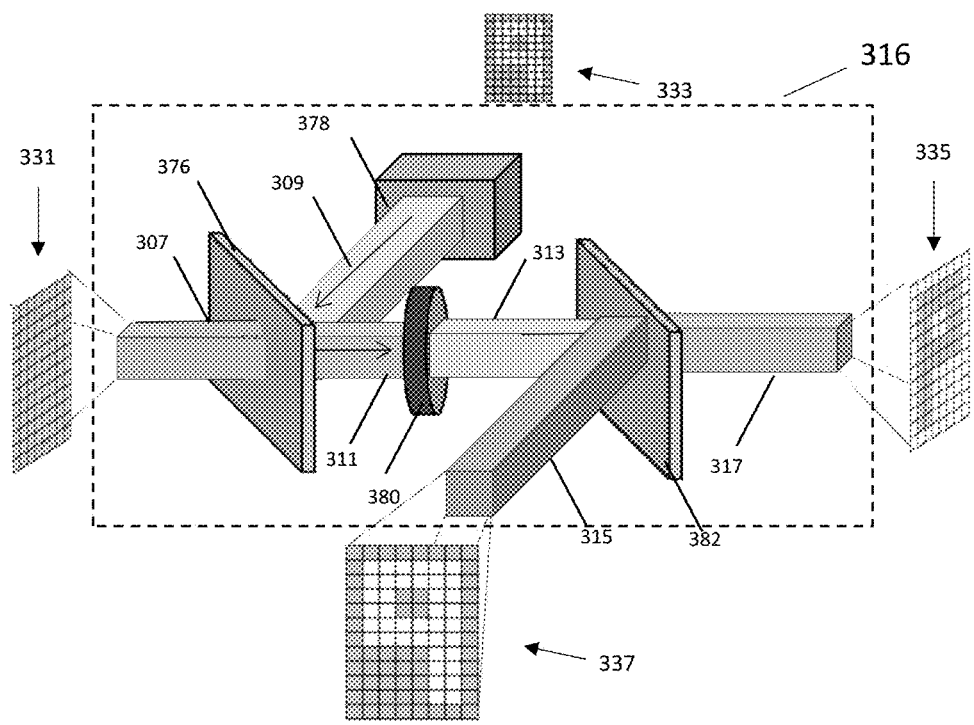
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
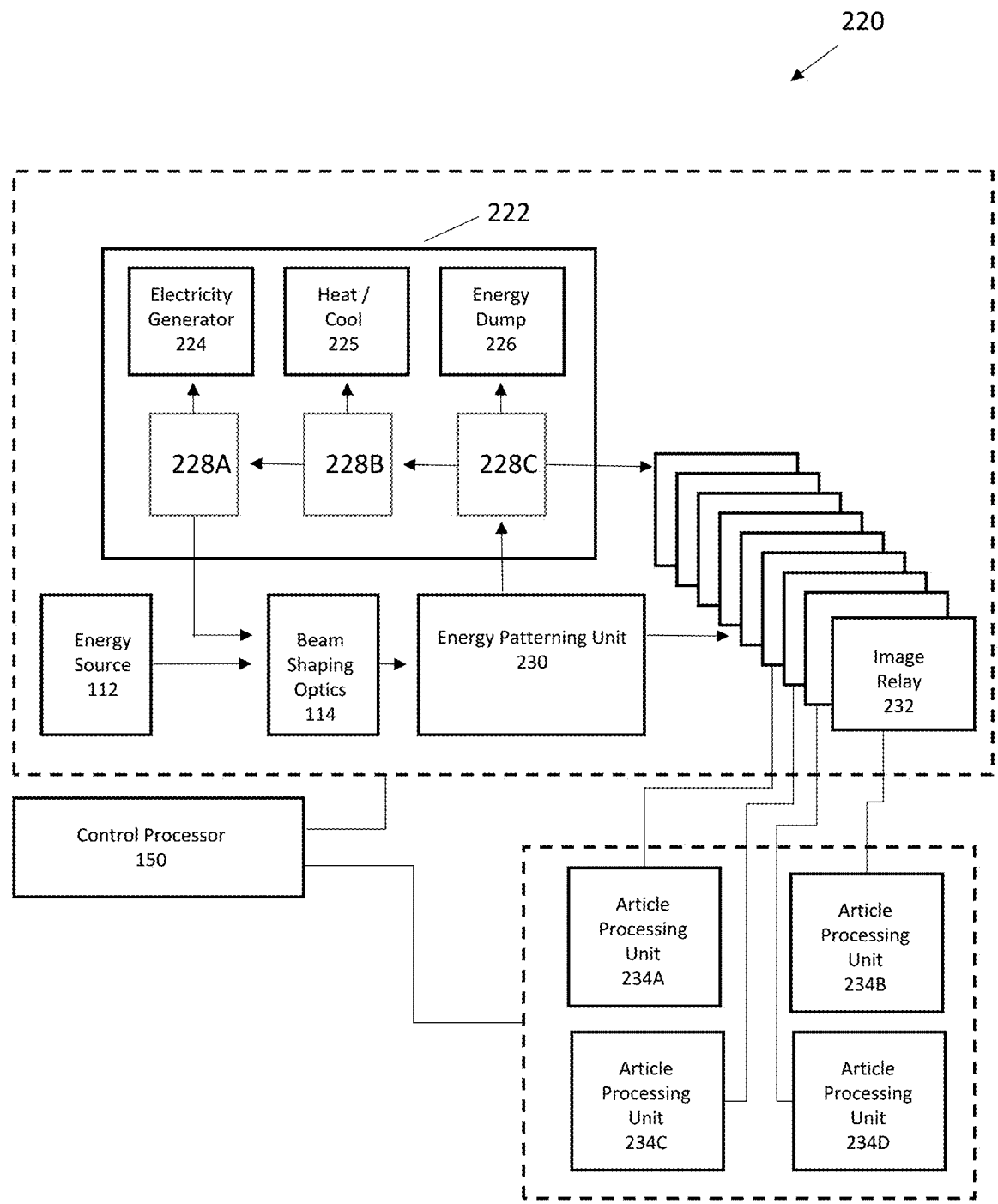
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
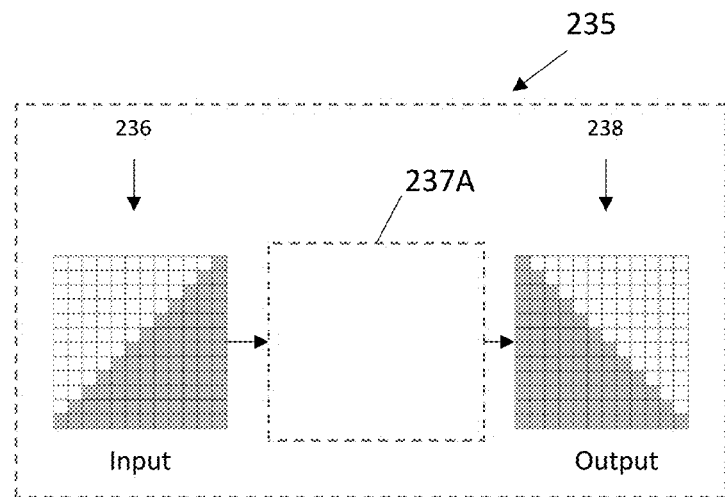
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
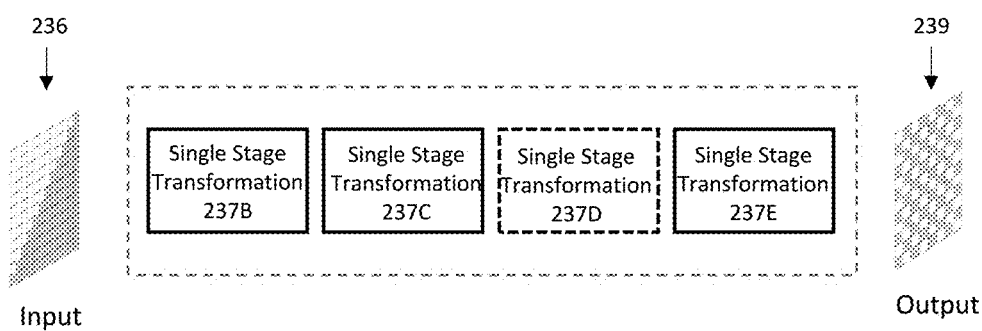
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
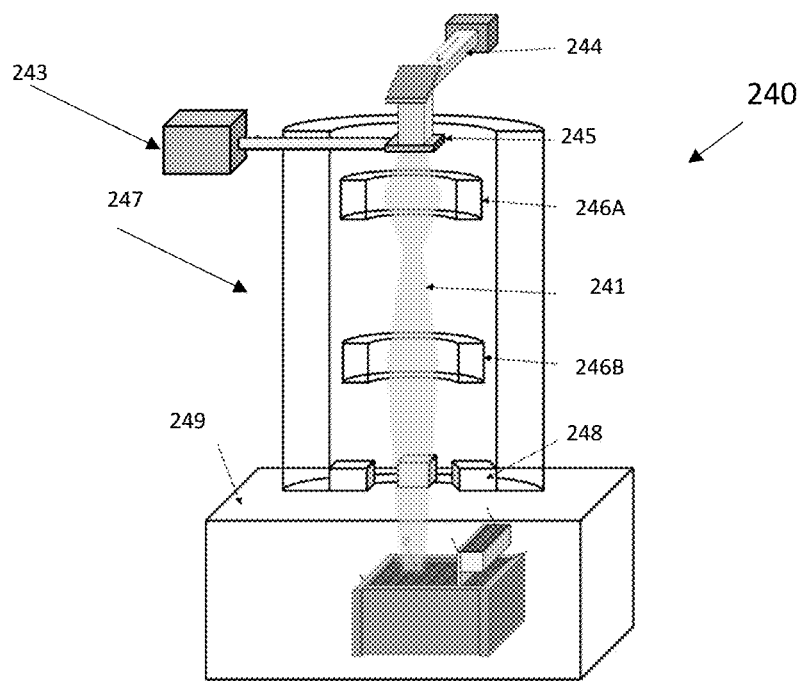
FIG. 3F illustrates an patternable electron energy beam additive manufacturing system.
Figure 3G:
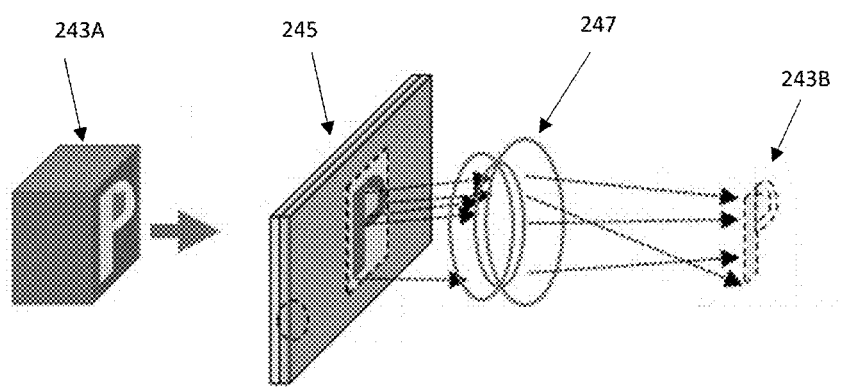
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
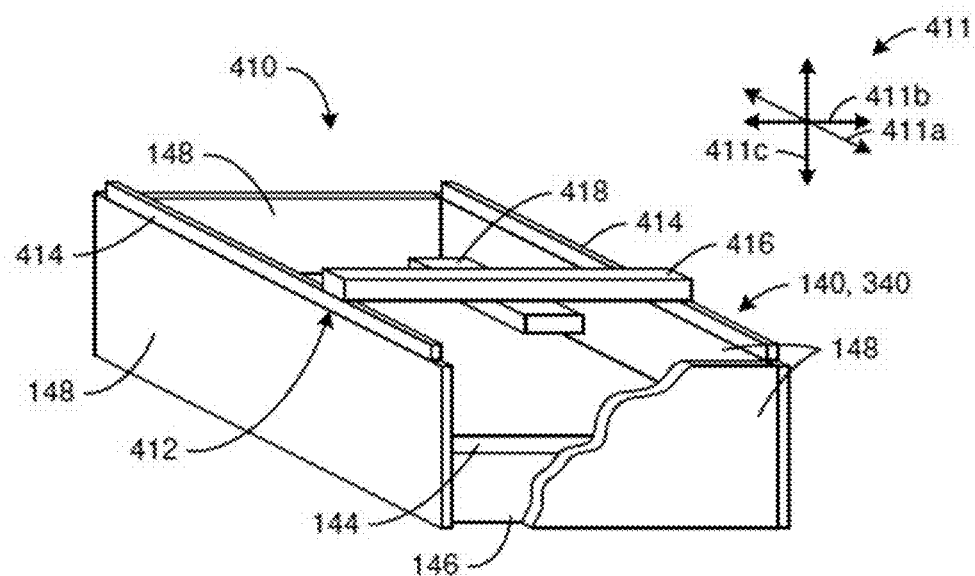
FIG. 4 is a perspective, partially cut-away, schematic diagram of one embodiment of a machine for executing a process of additive manufacture in accordance with the present invention.

Referring to FIG. 4, in selected embodiments, a machine 410 may be a device or system that executes a process of additive manufacture with at least some level of autonomy. For example, a machine 410 may be or comprise an additive manufacturing system 100, 300. In certain embodiments, the process of additive manufacture executed by a machine 410 may comprise powder-bed fusion in the form of direct metal laser sintering (DMLS), electron beam melting (EBM), selective heat sintering (SHS), selective laser melting (SLM), selective laser sintering (SLS), or the like. At a manufacturing facility comprising multiple machines 410, the processes of additive manufacture executed by the multiple machines 410 may be independent of each other. Thus, different machines 410 may start their respective processes at different times, manufacture the same or different parts, and so forth.

In discussing machines 410 in accordance with the present invention, it may be helpful to define a uniform coordinate system 411. Accordingly, certain machines 410 may correspond to or define longitudinal, lateral, and transverse directions 411a, 411b, 411c orthogonal to one another. The longitudinal direction 411a may correspond to a long axis of a machine 410. The lateral direction 411b may combine with the longitudinal direction 411a to define a horizontal plane. That is, the longitudinal and lateral directions may both extend within a horizontal plane. The transverse direction 411b may extend up and down in alignment with gravity.

Machines 410 in accordance with the present invention may have any suitable configuration. For example, in selected embodiments, a machine 410 may comprise a powder-bed-fusion printer. Accordingly, a machine 410 may include an energy patterning system 110, 310, an article processing unit 140, 340 (e.g., a sub-assembly comprising a dispenser 142 for selectively distributing layers of granular material 144, a build platform 146 or bed 146 over which various layers of the granular material 144 may be distributed, various walls 148 positioned to contain and/or support the various layers of the granular material 144, or the like or a combination or sub-combination thereof), a controller 150, a gantry system 412, or the like or a combination or sub-combination thereof.

A gantry system 412 may include one or more longitudinal rails 414 extending in the longitudinal direction 411a, a carriage 416 selectively moving in the longitudinal direction 411a along the one or more longitudinal rails 414, one or more lateral rails (not shown) forming part of the carriage 416, and a print head 418 selectively moving in the lateral direction 411b along the one or more lateral rails. A print head 418 may comprise an energy patterning system 110, 310 or some portion thereof. Relative motion in the transverse direction 411c between a print head 418 and a bed 146 (e.g., motion to accommodate new layers of granular material 144 as they are laid down on a bed 146) may be accomplished by incrementally moving the print head 418 away from the bed 146, incrementally moving the bed 146 away from the print head 418, or some combination thereof.

A machine 410 in accordance with the present invention may have any suitable size. For example, the bed 146 of a machine 410 may extend from about 0.5 to about 12 meters in the longitudinal and/or lateral directions 411a, 411b. Relative motion between a print head 418 and a bed 146 and the sizing of various walls 148 may accommodate a buildup of granular material 144 from about 0.5 to about 5 meters.

Figure 5:
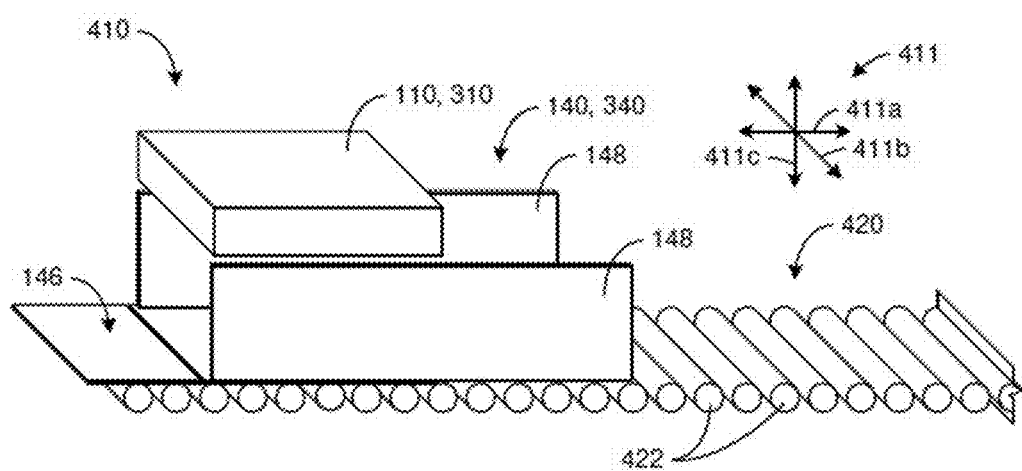
FIG. 5 is a perspective, partially cut-away, schematic diagram of an alternative embodiment of a machine for executing a process of additive manufacture in accordance with the present invention.

Referring to FIG. 5, in selected embodiments, a machine 410 in accordance with the present invention may enable or support substantially continuous additive manufacture of parts that are long (e.g., continuous parts that are longer in the longitudinal direction 411a than the machine 410 can print in its printing range of motion). This may be accomplished by manufacturing a part in segments.

For example, in certain embodiments, a machine 410 in accordance with the present invention may (1) manufacture a first segment of a part, (2) advance the part a selected distance down a conveyor 420, (3) manufacture a second segment of the part, (4) advance the part a selected distance down the conveyor 420, and (5) repeat until all segments of the part have been completed. In this manner, additive manufacture and clean-up (e.g., separation and/or reclamation of unused or unamalgamated granular material 144) may be performed in parallel (i.e., at the same time) at different locations or zones on the conveyor 420. Thus, additive manufacture in accordance with the present invention need not stop for removal of granular material 144 and/or parts.

In such embodiments, a bed 146 may form part of, be supported by, and/or ride on a conveyor 420. A conveyor 420 may comprise one or more powered rollers 422 that rotate as directed by a controller 150. Alternatively, a conveyor 420 may comprise a belt extending around a plurality of rollers 422, one or more of which may be powered and rotate as directed by a controller 150. An energy patterning system 110, 310 or selected components thereof may be configured to move incrementally in the transverse direction 411c with respect to the conveyor 420. That is, a machine 410 may include a bed 146 that is fixed in the lateral and transverse directions 411b, 411c and a print head 418 that indexes (e.g., incrementally moves) in the transverse direction 411c to change the focal point to accommodate new (i.e., higher) layers of material as they are laid down on the bed 146.

As a granular material 144 is laid down, layer after layer, it may be necessary to contain the granular material 144 so that is does not move, shift, fall away from a part 410, or the like during additive manufacture. Accordingly, a machine may include one or more walls 148. Certain walls 148 may be stationary. That is, they may not move with a conveyor 420. Other walls 148 may be traveling walls 148 that move with a conveyor 420. For example, in selected embodiments, two stationary walls 148 may block granular material 144 from falling off the sides of a conveyor 420 in a lateral direction 411b, while two or more traveling walls 148 may contain the granular material 144 in the longitudinal direction 411a.

After a completed segment of a part has been advanced down a conveyor 420, a new process of additive manufacture may have a "clean slate" to begin creating the next segment of the part. This new process may include amalgamating selected granules to a near or trailing side of a traveling wall 148, thereby maintaining the longitudinal continuity (i.e., the continuous structural connection in the lateral direction 411a between a segment that is currently being formed and all previously formed segments) of the part. Thus, certain traveling walls 148 may form the boundaries between the various segments of a part. Moreover, such traveling walls 148 may intersect any part that spans them. Accordingly, before a part is ready to use, selected portions of such walls 148 may need to be removed (e.g., broken off, cut off, ground off, or the like) from the part.

Thus, a machine 410 in accordance with the present invention may define or include multiple zones. Different tasks may be performed in different zones. In selected embodiments, different zones may correspond to different locations along a conveyor 420. Accordingly, a conveyor 420 may advance a part through the various zones of a machine 410.

In certain embodiments, a machine 410 may include three zones. A first zone may correspond to, include, or span the portion of a conveyor 420 where additive manufacture occurs. Thus, a first zone may correspond to the area on a conveyor 420 where the various layers of granular material 144 are being laid down and granular material 144 is being maintained in intimate contact with a part.

A second zone may directly follow a first zone. A second zone may be characterized by a significant portion of the unamalgamated portion of a granular material 144 moving away from a part. For example, in a second zone, one or more walls 148 (e.g., stationary walls 148) may terminate so that the unamalgamated portion of a granular material 144 may no longer be fully contained in the lateral direction 411b. As a result, some of the unamalgamated portion of a granular material 144 may spill off the sides of a conveyor 420. The spilling granular material 144 may fall into one or more containers where it may be collected and reused.

In certain embodiments, some of the unamalgamated portion of a granular material 144 may not "drain" off of a conveyor 420. Accordingly, within a second zone, this remainder of the granular material 144 may be removed, cleaned-up, or the like in any suitable manner. For example, a vacuum mechanism having a collection port that is controlled (e.g., moved) manually or robotically may be used to collect the remainder. Alternatively, or in addition thereto, one or more flows of pressurized gas that are controlled (e.g., aimed) manually or robotically may be used to dislodge the remainder from certain crevices, sweep the remainder off a conveyor 420, and/or move the remainder to one or more locations where it can be accessed by a vacuum.

A third zone may directly follow a second zone. A third zone may be characterized by a portion of a part within the third zone being exposed to view (e.g., completely, substantially, or partially exposed to view by the removal or movement of a significant portion of the unamalgamated portion of a granular material 144) without the part changing its position in the lateral and transverse directions 411b, 411c.

For example, in certain embodiments, a leading portion of a part may reach a third zone while a trailing portion of the part is still being manufactured within the first zone. Accordingly, in selected embodiments, a conveyor 420, a bed 146, one or more traveling walls 148, or the like or a combination or sub-combination thereof may cooperating to maintain a leading portion of a part in the same position in the lateral and transverse directions 411a, 411c as the leading portion occupied within the first zone and the second zone. Thus, the position of the leading portion of the part may not excessively disrupt, distort, or the like additive manufacture that is occurring on a trailing portion of the part in the first zone.

Accordingly, a machine 410 that enables or supports substantially continuous additive manufacture of parts that are long may itself be long. That is, the conveyor 420 of such a machine 410 may need to be longer than the longest part to be manufactured by the machine 410.

Figure 6:
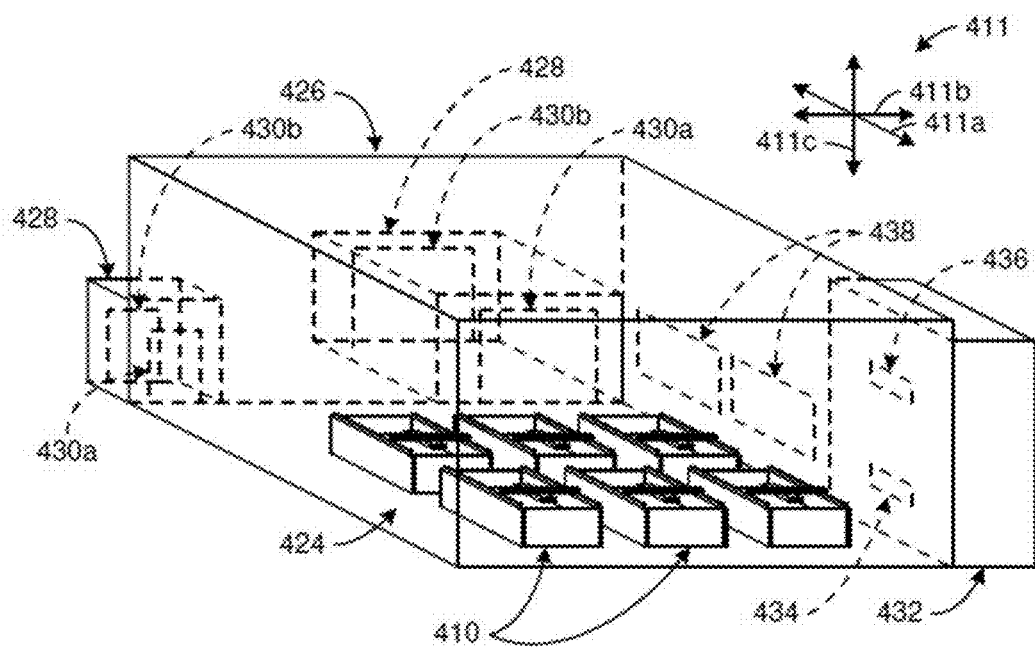
FIG. 6 is a perspective, schematic diagram of one embodiment of an enclosure for controlling a working environment surrounding multiple machines contained within the enclosure in accordance with the present invention.

Referring to FIG. 6, a manufacturing facility in accordance with the present invention may comprise one or more work areas 424. A work area 424 may be a space where one or more tasks corresponding to the manufacture of one or more parts are performed. A work area 424 may include the tools, structures, materials, or the like needed to perform the one or more tasks associated therewith. Different work areas 424 within a manufacturing facility may have different tasks associated therewith. In selected embodiments, the tasks associated with a particular work area 424 may be those that reason or efficiency dictates should be performed together, adjacent one another in a particular sequence, or the like. For example, one particular work area 424 within a manufacturing facility may be tasked with creating a part using powder-bed fusion. Accordingly, that work area 424 may contain one or more machines 410, a supply of granular material 144, and so forth.

Different work areas 424 may have different environmental requirements. When the requirements for a particular work area 424 differ from a natural environment (e.g., a typical temperature, pressure, gaseous make-up, or the like), pose a threat to a natural environment, or the like, the particular work area 424 may be contained within an enclosure 426. An enclosure 426 may separate an environment corresponding to a work area 424 contained therewithin from one or more other environments. Accordingly, an enclosure 426 may control one or more environmental conditions of a work area 424 as desired or necessary.

For example, certain granular materials 144 may be chemically sensitive to the presence of oxygen (e.g., gaseous oxygen). Some, when in an oxygenated environment, pose a significant risk of explosion. Alternatively, or in addition thereto, oxygen may act as an oxidizing agent during a high temperature amalgamation of a granular material 144. The resulting oxidation may corrupt, harden, or otherwise adversely affect the structural and/or chemical properties of the part being manufactured.

Accordingly, in selected embodiments, an enclosure 426 corresponding to certain powder-bed-fusion processes may enable one or more machines 410 contained there within to operate in a environment with oxygen levels below atmospheric levels by restricting an exchange of gaseous matter between an interior of the enclosure 426 and an exterior of the enclosure 426. In certain embodiments, this may be accomplished by making an enclosure 426 gas-tight or substantially gas-tight and filling the enclosure 426 with an inert or substantially inert gas such as nitrogen, argon, carbon-dioxide, other noble gas, or the like or a combination or sub-combination thereof. Accordingly, an enclosure 426 may prevent or lower the risk of contamination due to oxidation and/or explosion due to an increased reactivity of powdered materials. In selected embodiments, all the various zones of a conveyor 420 may be contained within such an enclosure 426 (e.g., within a single enclosure 426).

In certain embodiments, a low oxygen environment may be an environment where the presence of gaseous oxygen is below a limiting oxygen concentration (LOC). The LOC may be defined as the limiting concentration of gaseous oxygen below which combustion is not possible regardless of the concentration of fuel. The LOC may vary with temperature, pressure, type of fuel (e.g., type of granular material 144), type of inert gas, and concentration of inert gas. The LOC corresponding to one enclosure 426 may be different than the LOC for another enclosure 426. Thus, the concentration of gaseous oxygen within any given enclosure 426 may be maintained below an LOC for that enclosure 426 (i.e., an LOC that takes into account the temperature, pressure, type of granular material 144, type of inert gas, and concentration of inert gas, etc. within that enclosure 426).

In other embodiments, a low oxygen environment may be an environment where the presence of gaseous oxygen is well below an LOC. For example, a low oxygen environment may correspond to gaseous oxygen levels at about 500 parts-per-million by volume or less, about 100 parts-per-million by volume or less, about 50 parts-per-million by volume or less, about 10 parts-per-million by volume or less, or about 1 parts-per-million by volume or less. Accordingly, in selected embodiments, a low oxygen environment in accordance with the present invention may be a substantially oxygen-free environment.

In certain embodiments, two or more work areas 424 may be connected via one or more interface mechanisms 428. An interface mechanism 428 may enable parts, material 144, personnel, or the like to pass smoothly and efficiently into and out of one or more work areas 424. In selected embodiments, one or more interface mechanisms 428 may provide a path, railway, conveyor, or the like for parts, material 144, personnel, etc. to travel. Alternatively, or in addition thereto, one or more interface mechanisms 428 may enable parts, material 144, personnel, or the like to pass into and out of one or more enclosure 426 without compromising the environment (e.g., the low oxygen and inert gas environment) within the enclosure 426. Accordingly, in selected embodiments, an interface mechanism 428 may include a door (e.g., a strip door). In other embodiments where more separation is needed, an interface mechanism 428 may include a pair of doors 430a, 430b that form a vestibule or antechamber. In still other embodiments where even more separation is needed, an interface mechanism 428 may include an airlock buffering between two incompatible environments (e.g., between an inert gaseous environment within an enclosure 426 and an active gaseous environment outside the enclosure 426).

An airlock may include at least two airtight (or substantially airtight) doors 430a, 430b. A first door 430a of an airlock may enable parts, materials 144, personnel, or the like to pass between the interior of the airlock and the interior of the corresponding enclosure 426. A second door 430b may enable parts, materials 144, personnel, or the like to pass between the interior of the airlock and an exterior environment surrounding the corresponding enclosure 426. An airlock may also include a gas exchange system that may purge and/or vent the airlock as desired or necessary to efficiently transition the gaseous environment within the airlock between a state compatible with the interior of the enclosure 426 and a state compatible with the environment exterior to the enclosure 426.

In selected embodiments wherein an enclosure 426 contains one or more machines 410, the number of machines 410 within the enclosure 426 divided by the number of airlocks interfacing with the enclosure 426 may be greater than one. Accordingly, multiple machines 410 within an enclosure 426 may share an airlock. That is, methods in accordance with the present invention may include (1) removing from an enclosure 426 through an airlock a first part manufactured by a first machine 410 in a first process of additive manufacture and (2) removing from the enclosure 426 through the airlock a second part manufactured by a second machine 410 in a second process of additive manufacture, wherein the second processing is independent of the first process. In certain embodiments, the number of machines 410 within an enclosure 426 divided by the number of airlocks interfacing with the enclosure 426 may be greater than two.

In general, the larger the airlock, the more expensive it may be to operate in terms of time, equipment, materials, work, or the like. Accordingly, different airlocks corresponding to a particular enclosure 426 may have different shapes and/or sizes. Thus, passing parts, material 144, personnel, or the like into and out of an enclosure 426 may include selected the best airlock for the job.

For example, at least one relatively large airlock corresponding to an enclosure 426 may be large enough (e.g., have a length, width, and height sufficient) to accommodate the largest part that will be manufactured by a machine 410 within the enclosure 426, while another relatively small airlock corresponding to the enclosure 426 may be just large enough to accommodate personnel passing into and out of the enclosure 426. Accordingly, if a human worker needs to enter an enclosure, he or she may do so most efficiently by using the relatively small airlock.

In certain embodiments, an enclosure 426 corresponding to a particular work area 424 may include one or more gas management systems 432 controlling the make-up of gaseous matter within an enclosure 426. In selected embodiments, a gas management system 432 may maintain concentrations of inert or substantially inert gas (e.g., nitrogen, argon, carbon-dioxide, or the like or a combination or sub-combination thereof) above a desired level (e.g., argon at or above about 70% by volume). Alternatively, or in addition thereto, a gas management system may maintain concentrations of oxygen and/or water vapor below desired levels (e.g., below 0.05% by volume for gaseous oxygen, below 0.05% by volume for water vapor).

In selected embodiments, a gas management system 432 may include one or more intake locations 434 and one or more outlet locations 436. A gas management system 432 may take in gas from within an enclosure 426 at one or more intake locations 434. A gas management system 432 may output gas into an enclosure 426 at one or more outlet locations 436. In certain embodiments, wherein an enclosure 426 contains one or more machines 410, one or more outlet locations 436 may be proximate the one or more machines 410 (e.g., directly over the print beds 146 of one or more machines 410) to provide a steady flow of inert gas thereto.

In certain embodiments, an enclosure 426 may include one or more windows 438. A window 438 may enable one or more persons outside an enclosure 426 to see and/or monitor what is happening inside the enclosure 426. Thus, one or more windows 438 may be important safety features of a manufacturing facility in accordance with the present invention.

If desired or necessary, one or more windows 438 may be configured to filter out certain wavelengths of light that are incident thereon. For example, a window 438 may filter out certain wavelengths associated with one or more lasers of one or more machines 410 within an enclosure 426. Alternatively, or in addition thereto, a window 438 may filter out wavelengths associated with outside light that is attempting to enter an enclosure 426 thought the window 438. Thus, a window 438 may protect persons outside an enclosure 426 and/or photosensitive materials or items within the enclosure 426.

In certain embodiments, an enclosure 426 may be optically and/or thermally insulated. Optical insulation (e.g., radiation shielding) may prevent certain wavelengths (e.g., wavelengths corresponding to the lasers of one or more machines 410) from escaping an enclosure. Thermal insulation may be used to maintain (e.g., more easily maintain) a desired temperature within an interior of the enclosure 426. For example, certain processes of additive manufacture may require or run better at higher temperatures (e.g., temperatures greater than "room temperature" or greater than about 20 to about 25° C.). Such processes may themselves also generate significant heat. Accordingly, an enclosure 426 may be insulated in order to trap at least some of that heat.

An enclosure 426 in accordance with the present invention may be a building. Accordingly, in addition to restricting an exchange of gaseous matter between an interior of the enclosure 426 and an exterior of the enclosure 426, the walls of an enclosure 426 may provide a weather barrier. Alternatively, an enclosure 426 may be housed within a building. Accordingly, the walls, roof, etc. of the building may provide a weather barrier and leave the walls, ceiling, etc. of an enclosure 426 to deal exclusively with restricting an exchange of gaseous matter between an interior of the enclosure 426 and an exterior of the enclosure 426, reducing a flow of heat between an interior of the enclosure 426 and an exterior of the enclosure 426, or the like. This may free an enclosure 426 to be constructed with materials, shapes, methods, or the like that may be incompatible with a weather barrier.

An enclosure 426 in accordance with the present invention may be constructed in any suitable manner. For example, in selected embodiments, an enclosure 426 may include one or more walls, ceilings, floors, or the like defining a generally rectangular shape or generally rectangular sections of an overall shape. The floor may comprise concrete (e.g., a sealed concrete surface). The walls and/or ceiling may comprise modular metal sheets or panels that are bolted or otherwise fastened together. One or more sealants, gaskets, or the like may used between adjoining sheets or panels to provide a gas-tight or substantially gas-tight seal. Alternatively, or in addition thereto, one or more films, coatings, or the like may be used to provide a gas-tight or substantially gas-tight seal.

In certain embodiments, the gaseous environment within one or more enclosures 426 may be incompatible with the respiratory requirements of one or more humans that may need to enter and/or work within the enclosure 426. Accordingly, to work within certain enclosures 426 in accordance with the present invention, one or more workers may don personal protective equipment (PPE). Thereafter, when the worker enters an enclosure 426, the PPE may create a barrier between the worker and the working environment within the enclosure 426.

In selected embodiments, the PPE worn by one or more workers may include a self-contained breathing apparatus (SCBA). A SCBA may be a closed circuit device that filters, supplements, and recirculates exhaled gas (e.g., a rebreather). Alternatively, SCBA may be an open circuit device that exhausts at least some exhaled gas (e.g., nitrogen, carbon dioxide, oxygen, water vapor, or a combination or sub-combination thereof) into a surrounding environment. In embodiments where an open circuit device is used, the amount exhaled by the one or more workers within an enclosure 426 may be quite small with respect to the over size of the enclosure 426. Accordingly, the release of oxygen, water vapor, or the like into the interior of the enclosure 426 may be sufficiently small as to be negligible or at least within acceptable limits (e.g., within the capacity of a gas management system 432 to rectify).

In certain embodiments, a SCBA may include a full face mask. If desired or necessary, such a mask may be configured to filter out certain wavelengths of light that are incident thereon. For example, a mask may filter out certain wavelengths associated with one or more lasers of one or more machines 410 within an enclosure 426. Thus, a mask may protect a worker operating within an enclosure 426 from incidental laser exposure, which is typically due to reflections, but may be to a misaligned system or a system undergoing an alignment procedure.

In selected embodiments, the PPE worn by one or more workers within an enclosure 426 may protect the workers from potential thermal and/or laser exposure. For example, when operating in an environment for powder-bed fusion, a worker may be exposed to high temperatures. Accordingly, the PPE for that worker may include a protective thermal suit (e.g., a suit that is or is like the structural turnout gear worn by firefighters).

Figure 7:
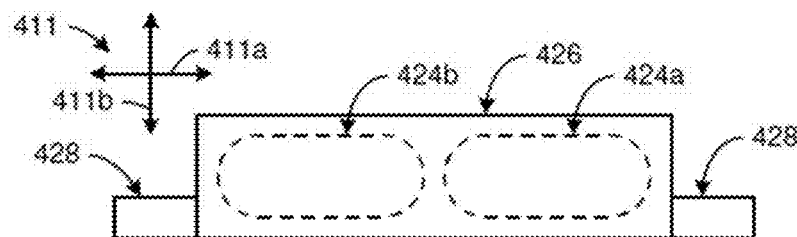
FIG. 7 is a schematic diagram of one embodiment of a manufacturing facility including an enclosure containing multiple work zones in accordance with the present invention.
Figure 8:
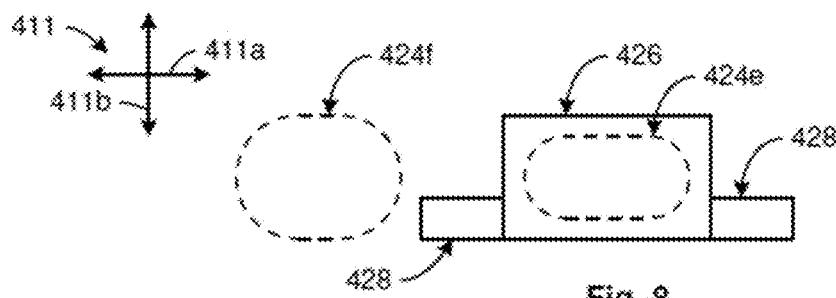
FIG. 8 is a schematic diagram of an alternative embodiment of a manufacturing facility including multiple enclosures that each containing a different work zone in accordance with the present invention.

Referring to FIGS. 7 and 8, in selected embodiments, the ratio of work areas 424 to enclosures 426 within at least a portion of a manufacturing facility may be one to one. That is, within at least a portion of a manufacturing facility, every work area 424 may be contained within its own dedicated enclosure 426. However, in other embodiments or other portions of a manufacturing facility, the number of work areas 424 divided by the number of enclosures 426 may be greater than one.

For example, in selected embodiments, the environment needed for one work area 424a may be substantially identical to or at least compatible with the environment needed for one or more other work areas 424b. Accordingly, if desired, those multiple work areas 424a, 424b may be contained within the same enclosure 426. An example of multiple work areas 424a, 424b that may be contained within one enclosure may include an area 424a were one or more parts are created by powder-bed fusion using a granular material 144 and an area 424b were unamalgamated portions of the granular material 144 are removed and recycled. Another example of two such work areas 424 may include an area 424 were one or more parts are created by powder-bed fusion using a granular material 144 and unamalgamated portions of the granular material 144 are removed and recycled and an area 424 where the granular material 144 is used as a shot media in a peening process.

Alternatively, or in addition thereto, certain work areas 424f may not need an enclosure 426. For example, certain work areas 424f may be fully compatible with an outdoor environment. Alternatively, those work areas 424f may be fully compatible with the typical environment found within a factory building. They may not need any environmental conditioning beyond the weather barrier that a building provides. This may be true even when one or more nearby or adjacent work areas 424e within the factory building do need an additional enclosure 426 (e.g., do need additional environmental conditioning beyond what a building provides). Accordingly, certain work areas 424 within at least a portion of a manufacturing facility may not be contained within any enclosure 426, may not be contained within any enclosure 426 other than a building providing a weather barrier, or the like.

Figure 9:
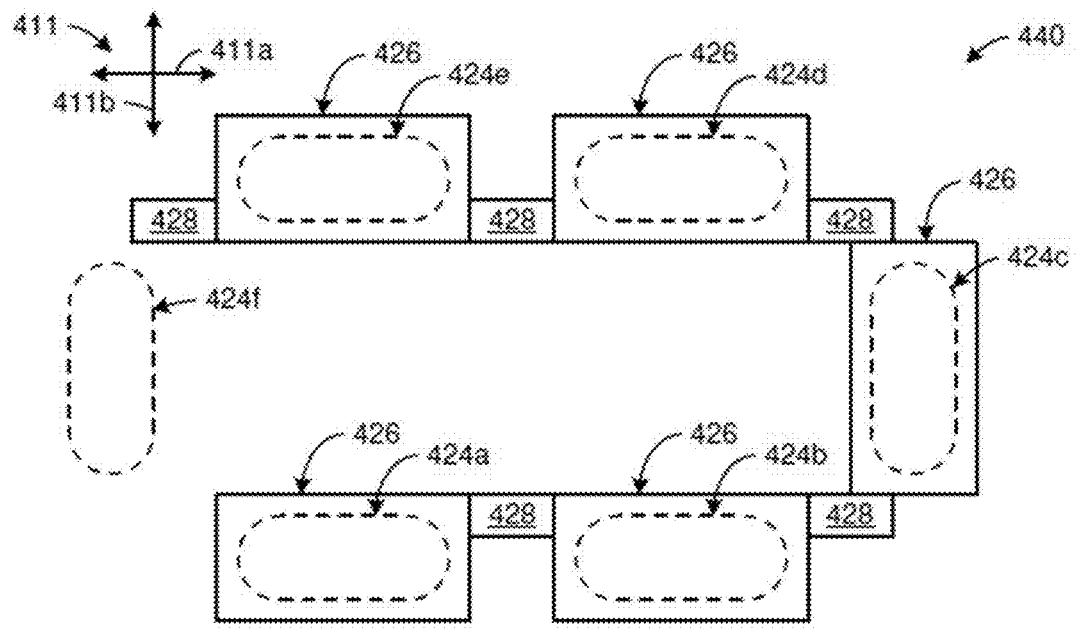
FIG. 9 is a schematic diagram of another alternative embodiment of a manufacturing facility including multiple enclosures or work zones arranged in a sequential configuration in accordance with the present invention.

Referring to FIG. 9, in selected embodiments, a manufacturing facility may comprise multiple work areas 424 connected by one or more interface mechanisms 428 to form a network 440. One or more of the work areas 424 forming such a network 440 may be contained within enclosures 426. One or more of the work areas 424 forming such a network 440 may not need an enclosure 426 and, therefore, may not be contained within one. One or more of the work areas 424 forming such a network 440 may be contained within one or more buildings. For example, in selected embodiments, all of the various work areas 424 forming a network 440 may be contained within a single building. In such embodiments, any work areas 424 contained within enclosures 426 may be work areas 424 that require more environmental conditioning than that provided by the building.

The various work areas 424 of a network 440 may be defined and/or arranged to correspond to certain manufacturing-related processes. Such processes may include creating parts via additive manufacture; removal of parts from the machines 410 that created them; removal of unamalgamated granular material 144; separating parts from a base or bed 146, one or more support structures (e.g., exterior portions of one or more traveling walls that extend through a part, one or more temporary structures printed to support a part during additive manufacture that will not be included within the finished part, etc.), or the like; heat treating; peening; powder coating, painting, anodizing, or the like; packaging for shipment; or the like or a combination or sub-combination thereof.

For example, in selected embodiments, a network 440 may include a first work area 424a for powder-bed fusion in an inert environment provided by an enclosure 426, a second work area 424b for removing granular material 144 from a build platform 146 in an enclosure 426, a third work area 424c for shot peening to improve surface finish in an enclosure 426, a fourth work area 424d for heat treating to anneal metal parts in an enclosure 426, a fifth work area 424e for removing parts from the build platform 146 in an enclosure 426, a sixth work area 424f for packing and shipping, or the like or a combination or sub-combination thereof.

In a first work area 424a, one or more machines 410 may be contained within an enclosure 426. The machines 410 may all be the same size or of varying sizes. Similarly, the one or more machines 410 may all be the same type or of varying types. For example, in selected embodiments, each of the one or more machines 410 within an enclosure 426 may amalgamate (e.g., unite, bond, fuse, sinter, melt, or the like) a particular granular material 144 in a batch process (e.g., in a process executed by a machine 410 corresponding to FIG. 4). In other embodiments, each of the one or more machines 410 within an enclosure 426 may amalgamate a particular granular material 144 in a continuous process (e.g., in a process executed by a machine 410 corresponding to FIG. 5). In still other embodiments, one or more machines 410 within an enclosure 426 may amalgamate a particular granular material 144 in a batch process, while one or more other machines 410 within the enclosure 426 may amalgamate the particular granular material 144 in a continuous process.

One or more machines 410 of a first work area 424a may be arranged so that sufficient space around the machines 410 is preserved for one or more human workers, robots, or the like to access the machines 410, remove parts therefrom, vacuum up unamalgamated granular material 144 for reuse, or the like. Alternatively, or in addition thereto, a first work area 424a may include various gantries, catwalks, or the like that enable one or more human workers, robots, or the like to access the machines 410 (e.g., visually access, physical access) from above. This may be helpful when a first work area 424a includes one or more large machines 410 where access from the edges or sides thereof may be insufficient for certain tasks.

An enclosure 426 corresponding to or containing a first work area 424a may maintain concentrations of inert or substantially inert gas (e.g., nitrogen, argon, carbon-dioxide, or the like or a combination or sub-combination thereof) above a desired level (e.g., argon at or above about 70% by volume). Alternatively, or in addition thereto, an enclosure 426 corresponding to or containing a first work area 424a may maintain concentrations of oxygen and/or water vapor below desired levels (e.g., below 0.05% by volume for gaseous oxygen, below 0.05% by volume for water vapor).

In a second work area 424b, unamalgamated granular material 144 may be removed from a build platform 146 through various methods. For example, a vacuum mechanism having a collection port that is controlled (e.g., moved) manually or robotically may be used to collect unamalgamated granular material 144 from around a part, off a build platform 146 or bed 146 or the like. Alternatively, or in addition thereto, one or more flows of pressurized gas that are controlled (e.g., aimed) manually or robotically may be used to dislodge the unamalgamated granular material 144 from certain crevices, sweep the unamalgamated granular material 144 off a build platform 146 or bed 146, and/or move the unamalgamated granular material 144 to one or more locations where it can be accessed by a vacuum.

An enclosure 426 corresponding to or containing a second work area 424b may maintain concentrations of inert or substantially inert gas (e.g., nitrogen, argon, carbon-dioxide, or the like or a combination or sub-combination thereof) above a desired level (e.g., argon at or above about 70% by volume). Alternatively, or in addition thereto, an enclosure 426 corresponding to or containing a second work area 424b may maintain concentrations of oxygen and/or water vapor below desired levels (e.g., below 0.05% by volume for gaseous oxygen, below 0.05% by volume for water vapor).

In selected embodiments, first and second work areas 424a, 424b may be contained within separate enclosures 426 as illustrated. In other embodiments, first and second work areas 424a, 424b may be contained within the same enclosure 426. Moreover, in certain embodiments (e.g., embodiments corresponding to a batch process using a machine 410 like the one shown in FIG. 4), first and second work areas 424a, 424b may geographically overlap to at least some degree, but may be temporally spaced in time (e.g., one or more tasks corresponding to one work area 424a may be performed at a different time than one or more tasks corresponding to the other work area 424b).

Alternatively, in other embodiments (e.g., embodiments corresponding to a continuous process using a machine 410 like the one shown in FIG. 5), first and second work areas 424a, 424b may be geographically adjacent one another, but may temporally overlap to some degree (e.g., one or more tasks corresponding to one work area 424a may be performed at the same time as one or more tasks corresponding to the other work area 424b). In such embodiments, a first zone of a machine 410 may correspond to or be a first work area 424a and a second zone (or a combination of the second and third zones) may correspond to or be a second work area 424b.

In a third work area 424c, a peening process may be manually or robotically applied to one or more parts. For example, in selected embodiments, a manual or robotic system may use the same granular material 144 (i.e., the same granular material 144 used to create the parts) as a shot media in a peening process to improve a surface finish of the parts. Accordingly, an enclosure 426 corresponding to or containing a third work area 424c may maintain concentrations of inert or substantially inert gas (e.g., nitrogen, argon, carbon-dioxide, or the like or a combination or sub-combination thereof) above a desired level (e.g., argon at or above about 70% by volume). Alternatively, or in addition thereto, an enclosure 426 corresponding to or containing a third work area 424c may maintain concentrations of oxygen and/or water vapor below desired levels (e.g., below 0.05% by volume for gaseous oxygen, below 0.05% by volume for water vapor).

In a fourth work area 424d, an enclosure 426 may be or comprise an oven for heat treating one or more parts. Such an enclosure 426 may, therefore, be configured to generate, retain, and control significant amounts of heat. The exact amount of heat may vary between the size of the enclosure 426, the nature of the parts being heat treated, and the like. If desired or necessary, such an enclosure 426 may also maintain concentrations of inert or substantially inert gas (e.g., nitrogen, argon, carbon-dioxide, or the like or a combination or sub-combination thereof) above a desired level (e.g., argon at or above about 70% by volume). Alternatively, or in addition thereto, an enclosure 426 corresponding to or containing a fourth work area 424d may maintain concentrations of oxygen and/or water vapor below desired levels (e.g., below 0.05% by volume for gaseous oxygen, below 0.05% by volume for water vapor).

In a fifth work area 424e, one or more build platforms 146 or beds 146 may be separated from the parts they supported, one or more exterior portions of one or more traveling walls that extend through parts may be removed, one or more temporary structures printed to support parts during additive manufacture that will not be included within the finished parts may be removed, or the like or a combination thereof. In selected embodiments, this may involve wire electrical discharge machining (EDM) process. In such embodiments, parts may be submerged within a bath of partially de-ionized water where the ion content is carefully controlled as part of the EDM process. An enclosure 426 for a fifth work area 424e may be included or omitted as desired or necessary.

In a sixth work area 424f, one or more parts may be prepared for shipping and/or shipped. For example, in a sixth work area 424f, one or more parts may be painted, packaged, wrapped with plastic, secured to one or more pallets, or the like and loaded on a truck for shipment. An enclosure 426 for a sixth work area 424f may be included or omitted as desired or necessary.

In selected embodiments, a network 440 may comprise a plurality of work areas 424 connected in series by one or more interface mechanisms 428. Such interface mechanisms 428 may enable one or more parts to flow smoothly and efficiently from one work area 424 to the next. Accordingly, the work areas 424 may be arranged in the network 440 so that the tasks associated therewith may be performed in the required or desired order.

Figure 10:
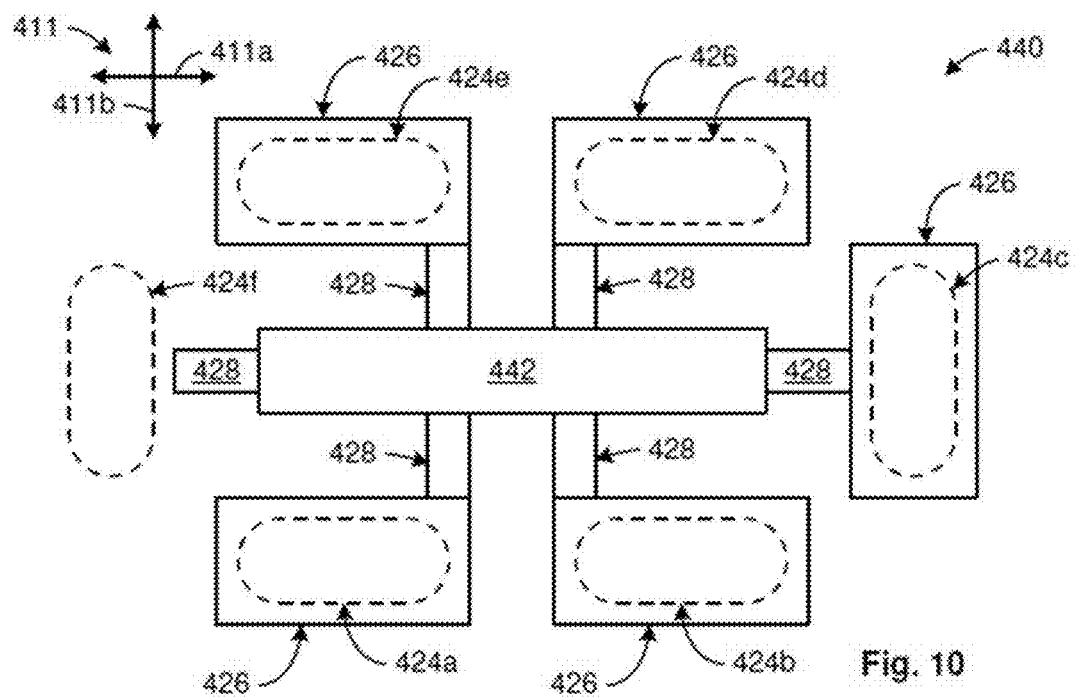
FIG. 10 is a schematic diagram of another alternative embodiment of a manufacturing facility including multiple enclosures or work zones arranged in hub-and-spoke configuration in accordance with the present invention.

Referring to FIG. 10, in certain embodiments, a network 440 may comprise a plurality of work areas 424 connected in a non-sequential manner by one or more interface mechanisms 428. Such interface mechanisms 428 may enable one or more parts to flow smoothly and efficiently from any work area 424 within the network 440 to any other work area 424 within the network 440. In selected embodiments, a non-sequential network 440 may include a hub 442. A hub 442 may comprise a path, intersection of rails, enclosure 426, or the like or a combination or sub-combination thereof that smoothly and efficiently interfaces between various interface mechanisms 428. Accordingly, a part may pass from one work area 424, through an interface mechanism 428 to a hub 442, through the hub 442 to another interface mechanism 428, and through that interface mechanism 428 to another work area 424.

Figure 11:
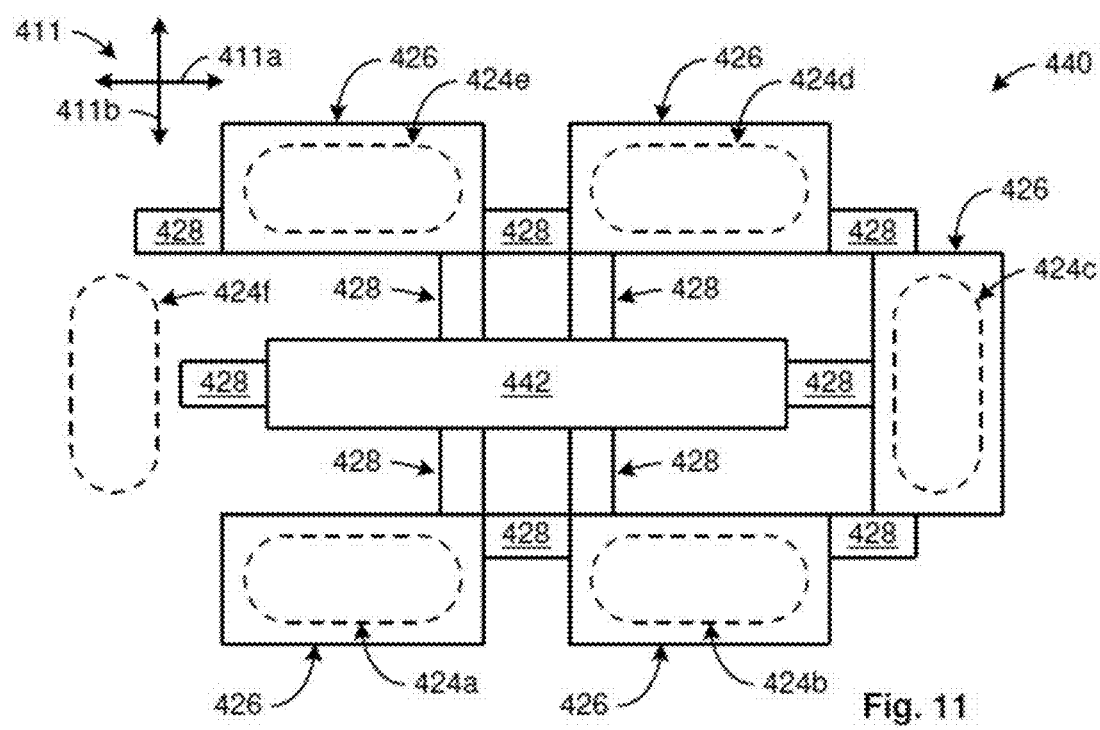
FIG. 11 is a schematic diagram of another alternative embodiment of a manufacturing facility including multiple enclosures or work zones arranged with connecting paths for both sequential and hub-and-spoke configurations in accordance with the present invention.

Referring to FIG. 11, in certain embodiments, a network 440 may comprise a plurality of work areas 424 connected in both a sequential manner and a non-sequential manner by one or more interface mechanisms 428. Accordingly, such a network 440 may provide the benefits of both types of networks 440.

Figure 12:
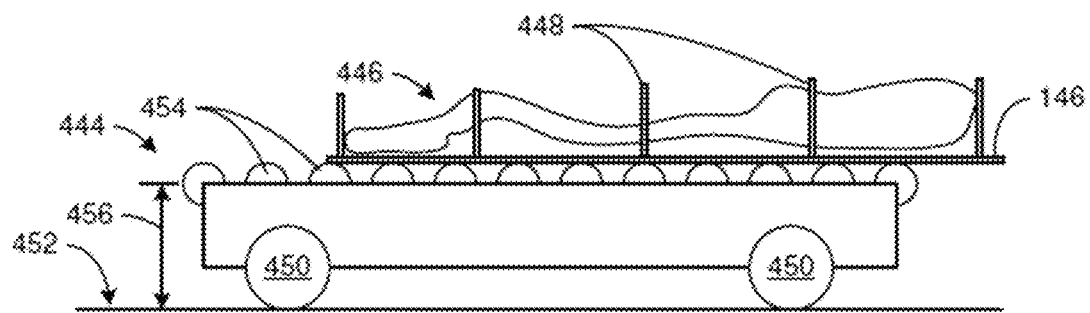
FIG. 12 is a schematic diagram of one embodiment of a wheeled vehicle in accordance with the present invention.
Figure 13:
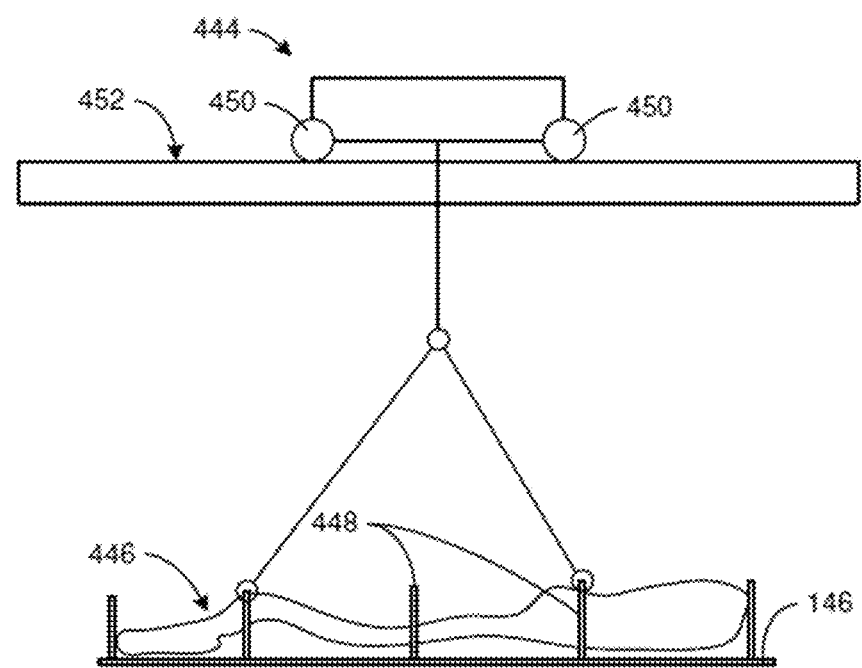
FIG. 13 is a schematic diagram of an alternative embodiment of a wheeled vehicle in accordance with the present invention.

Referring to FIGS. 12 and 13, in selected embodiments, a network 440 may include one or more vehicles 444. A vehicle 444 may provide a mechanism for supporting and transporting one or more parts 446 through a network 440 (e.g., into and out of one or more work areas 424, through one or more interface mechanisms 428, through one or more hubs 442, or the like or a combination thereof). That is, certain parts 446 (particularly when combined with build platforms 146 or beds 146 and/or traveling walls 448 or other temporary structures) may be quite large and/or heavy (e.g., weigh over 2,000 kilograms). Accordingly, vehicles 444 may facilitate the transport of those parts 446.

Vehicles 444 in accordance with the present invention may operate in any suitable manner. For example, vehicles 444 may transport print beds 146, parts 446, or other materials by rolling or otherwise moving over a path (e.g., a concrete floor), conveyor system, rail, or combination of multiple rails using traditional railroad concepts, linear movement on a track using an encoder, linear motion provided by a pulley system, motion and/or levitation provided by magnetic levitation rails, motion via a conveyor system or belt, or the like or a combination or sub-combination thereof.

Accordingly, in selected embodiments, a vehicle 444 may have wheels 450 that roll on a supporting surface 452. A support surface 452 may be a floor (e.g., a floor having a visually, electronically, or magnetically detectable path applied thereto or embedded therewithin). A support surface 452 may also be one or more rails. Such rails may be located below a part 446 being carried by a vehicle 444. Alternatively, such rails may be located above a part 446 being carried by a vehicle 444. That is, the rails may be overhead rails and a vehicle 44 may be carriage or trolley rolling on the overhead rails while suspending a part 446 therebelow.

The supporting surface 452 over which a vehicle 444 may roll may extend into and out of one or more work areas 424, through one or more interface mechanisms 428, through one or more hubs 442, or the like or a combination thereof. Accordingly, each section of a supporting surface 452 may be part of a work area 424, an interface mechanism 428, a hub 442, or the like. This may enable a vehicle 444 to transport, in one or more trips, one or more parts 446 from inside an enclosure 426 (e.g., one or more parts 446 created by one or more machines 410 located within the enclosure 426), through an interface mechanism 428 (e.g., through an airlock as the airlock operates to buffer between a gaseous environment within the enclosure and a gaseous environment outside the enclosure), and to a location exterior to both the enclosure 426 and the interface mechanism 428 (e.g., to a location corresponding to another work area 424, to a location within another enclosure 426, to a location within a hub 442, or to some other location). Moreover, this may enable the vehicle 444 to continuously support the weight of the one or more parts 446 (e.g., weight of 2,000 kilograms, or greater per part) during such transport.

In selected embodiments, one or more doors 430 of an interface mechanism 428 may be configured to seal against a supporting surface 452. For example, if a support surface 452 comprises a rail, one or more doors 430 of an interface mechanism 428 may have a sealing element shaped to selectively abut and seal against that rail. Thus, vehicles 444 may pass through, into, and/or out of one or more interface mechanisms 428 as they perform their intended functions (e.g., as they function as an airlock)

A vehicle 444 in accordance with the present invention may be controlled and/or operated manually, automatically, autonomously, or semi-autonomously. For example, in selected embodiments, one or more vehicles 444 may be pushed and/or steered by one or more human operators. In other embodiments, various on-board or off-board control systems may sense what is happening with respect to a vehicle 444 and instruct the vehicle 444 when to move, when to stop, how to steer, and the like.

In selected embodiments, a vehicle 444 may include various features that facilitate loading and unloading one or more parts 446. For example, in selected embodiments, a vehicle 44 may include one or more rollers 454. This may enable large and/or heavy parts 446 to roll onto the vehicle 444 without sliding or lifting. Additionally, a vehicle 44 may have a height 456 that matches one or more other components within a network 440 (e.g., that matches the height of a conveyor 420 of a machine 410) so that exchanges (e.g., exchanges of parts 446) between the vehicle 444 and those components can be performed without lifting. Alternatively, a vehicle 444 may have an adjustable height 456 so that it can interface with various components having various heights.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," "selected embodiments," "certain embodiments," etc., indicate that the embodiment or embodiments described may include a particular feature, structure, or characteristic, but every embodiment need not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to apply such feature, structure, or characteristic to other embodiments whether or not explicitly described.

The invention claimed is:

1. A method of additive manufacture, the method comprising:
    operating a manufacturing facility comprising a first enclosure, a first machine contained within the first enclosure, a first gas management system, and an airlock, the airlock comprising an interior, a first door interfacing between the interior of the airlock and an interior of the first enclosure, and a second door interfacing between the interior of the airlock and an area exterior to the first enclosure;
    creating, by the first machine during the operating, a first part via a first process comprising additive manufacture using an energy beam to amalgamate selected portions of a powder located within the first enclosure;
    maintaining, by the first gas management system during the creating, gaseous oxygen within the first enclosure below atmospheric levels;
    transporting the first part from inside the first enclosure, through the airlock as the airlock operates to buffer between a gaseous environment within the first enclosure and a gaseous environment outside the first enclosure, and to the area; and
    continuously supporting the first part during the transporting.

2. The method of claim 1, wherein:
the first part has a weight; and
the continuously supporting comprises continuously supporting, by a vehicle, conveyor system, railway, or belt during the transporting, the weight of the first part from inside the first enclosure, through the airlock, and to the area.

3. The method of claim 2, further comprising performing proximate the area a second process corresponding to manufacture of the first part, wherein the second process comprises removal of unamalgamated powder, heat treatment, peening, cutting, or painting.

4. The method of claim 3, wherein the area is within a second enclosure.

5. The method of claim 4, further comprising maintaining, by a second gas management system during the performing, gaseous oxygen within the second enclosure at or below a limiting oxygen concentration.

6. The method of claim 5, wherein:
the vehicle is a wheeled vehicle; and
the transporting comprises rolling, by the wheeled vehicle, over a supporting surface.

7. The method of claim 6, wherein the supporting surface is a floor.

8. The method of claim 6, wherein the supporting surface is at least one rail located below the first part.

9. The method of claim 6, wherein the supporting surface is at least one rail located above the first part.

10. The method of claim 1, wherein the transporting comprises rolling, by a wheeled vehicle, over a floor, at least one rail located below the first part, or at least one rail located above the first part.

11. The method of claim 10, further comprising removing from the first enclosure through the airlock a second part manufactured by a second machine in a second process comprising additive manufacture, the second process being independent of the first process.

12. The method of claim 11, wherein the removing comprises transporting, by the wheeled vehicle, the second part from inside the first enclosure, through the airlock as the airlock operates to buffer between the gaseous environment within the first enclosure and the gaseous environment outside the first enclosure, and to the area.

13. The method of claim 12, wherein:
the second part has a weight; and
the method further comprises continuously supporting, by the wheeled vehicle, the weight of the second part during the transporting of the second part from inside the first enclosure, through the airlock, and to the area.

14. The method of claim 1, further comprising assisting, by a human contained completely within the first enclosure, in removing unamalgamated powder from around the first part.

15. The method of claim 14, further comprising wearing, by the human during the assisting, a self contained breathing apparatus.

16. The method of claim 1, wherein the first process comprises:
distributing a first layer of the powder;
directing radiant energy at a first subset of granules within the first layer;
distributing a second layer of the powder over the top of the first layer; and
directing radiant energy at a second subset of granules within the second layer.

17. The method of claim 16, wherein the first process further comprises:
melting or sintering the first subset of granules; and
melting or sintering the second subset of granules.

18. The method of claim 17, wherein the first process further comprises:
assisting, by a human contained completely within the first enclosure, in removing unamalgamated granules of the powder from around the first part; and
wearing, by the human during the assisting, a self contained breathing apparatus.

19. A method of additive manufacture, the method comprising:
operating a manufacturing facility comprising an enclosure, a first machine contained within the enclosure, a second machine contained within the enclosure, a gas management system, and an airlock, the airlock comprising an interior, a first door interfacing between the interior of the airlock and an interior of the enclosure, and a second door interfacing between the interior of the airlock and an area exterior to the enclosure;
creating, by the first machine during the operating, a first part via a first process comprising amalgamating selected portions of a first quantity of powder located within the enclosure;
creating, by the second machine during the operating, a second part via a second process independent of the first process, the second process comprising amalgamating selected portions of a second quantity of powder located within the enclosure;
maintaining, by the gas management system during the creating of the first and second parts, gaseous oxygen within the enclosure below atmospheric level;
conveying the first part out of the enclosure through the airlock as the airlock operates to buffer between a gaseous environment within the first enclosure and a gaseous environment outside the enclosure; and
conveying the second part out of the enclosure through the airlock as the airlock operates to buffer between the gaseous environment within the enclosure and the gaseous environment outside the enclosure.

20. The method of claim 19, wherein:
the conveying the first part comprises continuously supporting, by a vehicle, conveyor system, railway, or belt, a weight of the first part as the first part moves from inside the enclosure, through the airlock, and to the area; and
the conveying the second part comprises continuously supporting, by the vehicle, conveyor system, railway, or belt, a weight of the second part as the second part moves from inside the enclosure, through the airlock, and to the area.

* * * * *